United States Patent
Whittemore, IV et al.

(10) Patent No.: US 9,196,779 B2
(45) Date of Patent: Nov. 24, 2015

(54) DOUBLE SIDED BARRIER FOR ENCAPSULATING SODA LIME GLASS FOR CIS/CIGS MATERIALS

(71) Applicant: Stion Corporation, San Jose, CA (US)

(72) Inventors: James H. Whittemore, IV, Hattiesburg, MS (US); Laila Dounas, San Jose, CA (US); Chester A. Farris, III, Yorba Linda, CA (US); Robert D. Wieting, Simi Valley, CA (US)

(73) Assignee: Stion Corporation, San Jose, CA (US)

( * ) Notice: Subject to any disclaimer, the term of this patent is extended or adjusted under 35 U.S.C. 154(b) by 573 days.

(21) Appl. No.: 13/622,843

(22) Filed: Sep. 19, 2012

(65) Prior Publication Data

US 2014/0014170 A1    Jan. 16, 2014

Related U.S. Application Data

(60) Provisional application No. 61/671,025, filed on Jul. 12, 2012.

(51) Int. Cl.
*H01L 21/00* (2006.01)
*H01L 31/06* (2012.01)
(Continued)

(52) U.S. Cl.
CPC .......... *H01L 31/06* (2013.01); *H01L 31/03923* (2013.01); *H01L 31/03928* (2013.01); *H01L 31/046* (2014.12); *H01L 31/18* (2013.01); *Y02E 10/541* (2013.01)

(58) Field of Classification Search
CPC ..... H01L 42/04; H01L 27/24; H01L 45/1233; H01L 45/144; H01L 45/06; H01L 31/022425; H01L 31/1804; H01L 31/068; H01L 27/14636; H01L 31/02168; H01L 31/0236; H01L 31/048; H01L 31/18; H01L 29/7869; H01L 31/0749; Y02E 10/50
See application file for complete search history.

(56) References Cited

U.S. PATENT DOCUMENTS 4,996,108 A    2/1991    Divigalpitiya et al.
5,125,984 A    6/1992    Kruehler et al.
(Continued)

OTHER PUBLICATIONS

Ellmer, K., et al., "Copper Indium Disulfide Solar Cell Absorbers Prepared in a One-Step Process by Reactive Magnetron Sputtering from Copper and Indium Targets," Elsevier Science B.V; Thin Solid Films vol. 413 (2002), 6 pages.
(Continued)

*Primary Examiner* — Michelle Mandala
(74) *Attorney, Agent, or Firm* — Kilpatrick Townsend & Stockton LLP

(57) ABSTRACT

A method of fabricating a thin film photovoltaic device is provided. The method subjects a soda lime glass substrate having a front side, backside, and edges to a first cleaning process and forms a first coating of silicon dioxide overlying the backside and the edges. The method further subjects the substrate to a second cleaning process and forms a second coating of silicon dioxide overlying the front side and the edges of the substrate. Furthermore, the method includes causing a barrier layer comprising the first coating and the second coating to encapsulate entirely the front side, backside, and edges. The barrier layer includes at least a thickness of oxygen rich silicon dioxide to contain any sodium bearing material within the substrate. Moreover, the method includes forming a thickness of metal material overlying the second coating on the front side followed by an absorber material and window material plus a top electrode.

15 Claims, 10 Drawing Sheets

(51) Int. Cl.
  *H01L 31/18* (2006.01)
  *H01L 31/0392* (2006.01)
  *H01L 31/046* (2014.01)

(56) References Cited

U.S. PATENT DOCUMENTS

| | | | |
|---|---|---|---|
| 5,261,968 | A | 11/1993 | Jordan |
| 5,501,744 | A | 3/1996 | Albright et al. |
| 5,536,333 | A | 7/1996 | Foote et al. |
| 5,578,103 | A | 11/1996 | Araujo et al. |
| 5,626,688 | A | 5/1997 | Probst et al. |
| 5,665,175 | A | 9/1997 | Safir |
| 5,985,691 | A | 11/1999 | Basol et al. |
| 6,258,620 | B1 | 7/2001 | Morel et al. |
| 6,310,281 | B1 | 10/2001 | Wendt et al. |
| 6,328,871 | B1 | 12/2001 | Ding et al. |
| 7,235,736 | B1 | 6/2007 | Buller et al. |
| 7,910,399 | B1 | 3/2011 | Wieting |
| 8,217,261 | B2 | 7/2012 | Wieting |
| 2006/0219288 | A1 | 10/2006 | Tuttle |
| 2006/0220059 | A1 | 10/2006 | Satoh et al. |
| 2007/0089782 | A1 | 4/2007 | Scheuten et al. |
| 2007/0151596 | A1 | 7/2007 | Nasuno et al. |
| 2007/0169810 | A1 | 7/2007 | Van Duren et al. |
| 2008/0041446 | A1 | 2/2008 | Wu et al. |
| 2008/0092945 | A1 | 4/2008 | Munteanu et al. |
| 2008/0092953 | A1 | 4/2008 | Lee |
| 2008/0121277 | A1 | 5/2008 | Robinson et al. |
| 2009/0021157 | A1 | 1/2009 | Kim et al. |
| 2010/0297798 | A1* | 11/2010 | Adriani et al. ............... 438/64 |
| 2011/0315207 | A1* | 12/2011 | Krajewski et al. ............ 136/256 |
| 2014/0193612 | A1* | 7/2014 | Yu et al. ...................... 428/143 |

OTHER PUBLICATIONS

International Search Report & Written Opinion of PCT Application No. PCT/US09/46161, date of mailing Jul. 27, 2009, 14 pages.
International Search Report & Written Opinion of PCT Application No. PCT/US09/46802, mailed on Jul. 31, 2009, 11 pages.
International Search Report & Written Opinion of PCT Application No. PCT/US09/59097, mailed on Dec. 23, 2009, 7 pages.
Onuma, Y., et al., "Preparation and Characterization of CuInS Thin Films Solar Cells with Large Grain, Elsevier Science B.V; Solar Energy Materials & Solar Cells" vol. 69 (2001) 9 pages.
Scofield, J., et al., "Sodium Diffusion, Selenization and Microstructural Effects Associated with Various Molydenum Back Contact Layers for CIS-Based Solar Cells," Proceedings of the 24 IEEE Photovoltaic Specialists Conference, 1995, 5 pages.
Gordillo, G., et al., "Electrical and Morphological Properties of Low Resistivity Mo thin Films," Brazilian Journal of Physics, vol. 36, Sep. 2006, 4 pages.

* cited by examiner

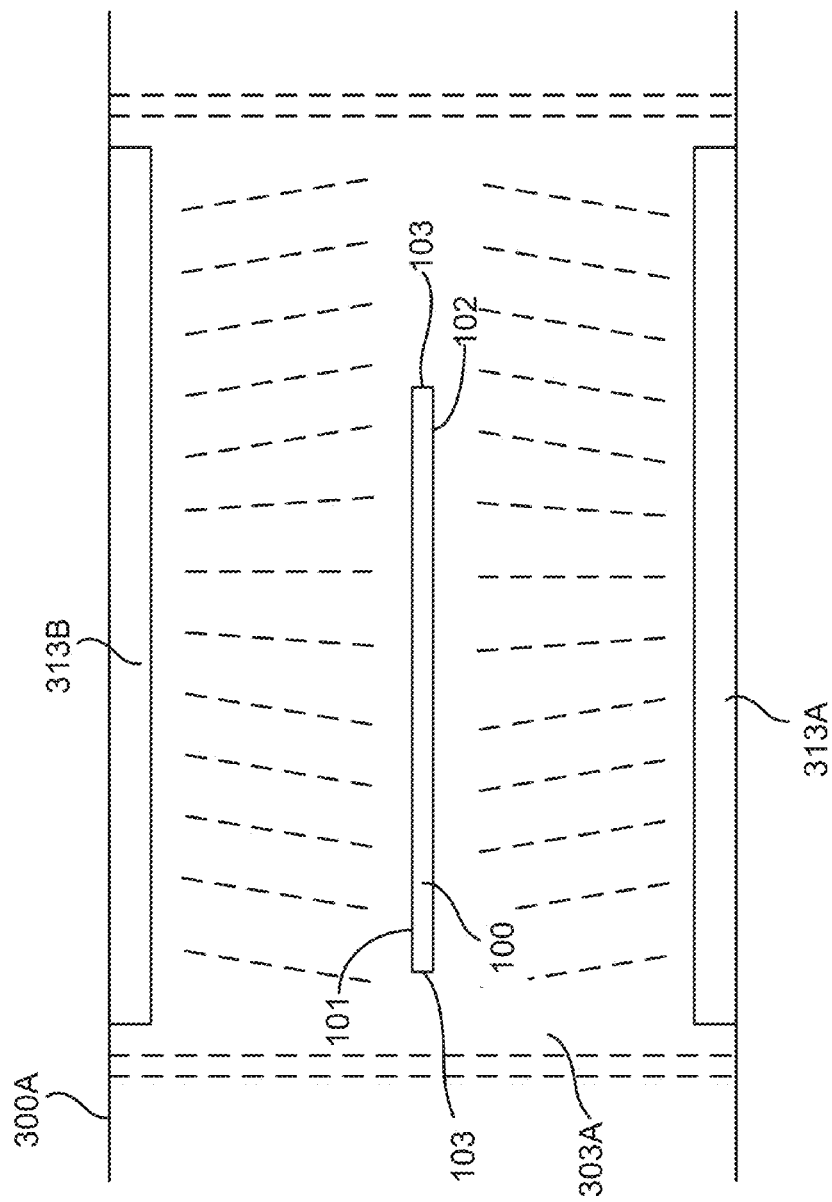

DOUBLE SIDED BARRIER FOR ENCAPSULATING SODA LIME GLASS FOR CIS/CIGS MATERIALS

CROSS-REFERENCES TO RELATED APPLICATIONS

This application claims priority to U.S. Provisional Patent Application No. 61/671,025, filed Jul. 12, 2012, commonly assigned, and hereby incorporated by reference in its entirety for all purposes.

BACKGROUND OF THE INVENTION

The present invention relates generally to photovoltaic materials and manufacturing methods. More particularly, the present invention provides a method and structure for fabricating thin film solar cells. Merely by way of example, the present method and structure are for the manufacture of copper indium gallium diselenide based thin film photovoltaic devices, but it would be recognized that the invention may have other configurations.

From the beginning of time, mankind has been challenged to find ways of harnessing energy. Energy comes in forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking. Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. Furthermore, integration of electrode layers, sodium-containing glass substrates, and overlying absorber layers was also problematic. These and other limitations of these conventional technologies can be found throughout the present specification and more particularly below.

BRIEF SUMMARY OF THE INVENTION

The present invention relates generally to photovoltaic materials and manufacturing methods. More particularly, the present invention provides a method and structure for fabricating thin film solar cells. Merely by way of example, the present method and structure may be used for the manufacture of copper indium gallium diselenide based thin film photovoltaic devices, but it would be recognized that the invention may have other configurations.

In a specific embodiment, the present invention provides a method of fabricating a thin film photovoltaic device. The method includes providing a soda lime glass substrate having a front side, backside, and edges. The method also includes subjecting the soda lime glass substrate to a first cleaning process. The method further includes forming a first coating of silicon dioxide bearing material overlying at least the backside and a first portion of the edges of the soda lime glass substrate in a vacuum environment. Furthermore, the method includes subjecting the soda lime glass substrate including the first coating to a second cleaning process outside the vacuum environment and forming a second coating of silicon dioxide bearing material overlying at least the front side and a second portion of the edges of the soda lime glass substrate in the vacuum environment. The method further includes causing a barrier layer comprising the first coating and the second coating to encapsulate entirely the front side, backside, and edges. The barrier layer includes at least a thickness of oxygen rich silicon dioxide to contain any sodium bearing material within the soda lime glass substrate. Moreover, the method includes forming a thickness of metal material comprising molybdenum overlying the second coating on the front side of the soda lime glass substrate, forming an absorber material comprising a copper species, indium species, gallium species, aluminum species, silver species, selenide species, and sulfide species overlying the thickness of metal material, forming a window material overlying the absorber material, and forming an electrode material overlying the window material.

In another specific embodiment, the invention provides a method of fabricating a thin film photovoltaic device. The method includes providing a soda lime glass substrate having a front side, backside, and edges and subjecting the soda lime glass substrate including the front side and back side to a first cleaning process, followed by forming a first coating of silicon dioxide bearing material overlying at least the back side and a portion of the edges of the soda lime glass substrate by subjecting a first silicon bearing target within a first vacuum environment. The method further includes subjecting the soda lime glass substrate with the first coating to a second cleaning process, turning over the soda lime glass substrate, and forming a second coating of silicon dioxide bearing material overlying at least the front side and a remaining portion of the edges of the soda lime glass substrate by subjecting a second silicon bearing target within a second vacuum environment. Furthermore, the method includes causing a barrier layer comprising the first coating combined with the second coating to encapsulate entirely the front side, backside, and edges of the soda lime glass substrate to contain any sodium bearing material within the soda lime glass substrate. The method also includes forming a thickness of metal material comprising molybdenum overlying the barrier layer on the front side of the soda lime glass substrate without breaking the second vacuum environment. Moreover, the method includes forming an absorber material comprising a copper species, indium species, gallium species, silver species, aluminum species, and a sulfide species overlying the thickness of metal material, forming a window material comprising an n-type semiconductor overlying the absorber material, and forming an electrode material overlying the window material. In an embodiment, the barrier layer includes a first thickness of silicon dioxide and a second thickness of silicon dioxide overlying the first thickness of silicon dioxide. In another embodiment, the first thickness of silicon dioxide is oxygen rich relative to an oxygen concentration of the second thickness of silicon dioxide, the first thickness of silicon dioxide having a higher density compared to the second thickness of silicon dioxide. In yet another embodiment, the second thickness of silicon dioxide facilitates a formation of substantially continuous line patterns through the thickness of metal material while the first thickness of silicon dioxide facilitates adhesion of the metal material to the absorber material substantially free from any de-lamination.

In an alternative embodiment, the present invention provides a thin-film photovoltaic device. The device includes a soda lime glass substrate having a front side, backside, and edges. The device further includes a barrier layer encapsulating the soda lime glass substrate. The barrier layer includes a first thickness of silicon dioxide overlying entirely the front side, backside, and edges. Furthermore, the device includes a seed layer overlying the barrier layer. The seed layer includes a second thickness of silicon dioxide at least overlying the first thickness of silicon dioxide on the front side of the soda lime glass substrate. The first thickness of silicon dioxide is oxygen rich relative to an oxygen concentration of the second thickness of silicon dioxide. The device further includes a metal material comprising molybdenum overlying the seed layer. Moreover, the device includes an absorber material comprising a copper species, indium species, gallium species, aluminum species, silver species, selenide species, and a sulfide species overlying the metal material, a window material comprising an n-type semiconductor overlying the absorber material, and an electrode material overlying the window material.

In yet another alternative embodiment, the present invention provides a thin-film structure for photovoltaic modules. The thin-film structure includes a glass substrate containing sodium species. The thin-film structure further includes a first barrier material overlying the glass substrate. The first barrier material includes a first thickness of silicon oxide having a density of about 1.1 to about 1.3 g/cm$^3$ or more. Additionally, the thin-film structure includes a second barrier material overlying the first barrier material. The second barrier material includes a second thickness of silicon oxide having a density of about 0.9 g/cm$^3$ or less. The second thickness of silicon oxide is characterized by an oxygen concentration poorer than the first thickness of silicon oxide and substantially zero trace of sodium species. The thin-film structure further includes a conductive material overlying the second barrier material. The conductive material includes a plurality of line patterns formed via laser scribing to remove the conductive material therein until the second barrier material is revealed or partially removed. Each line pattern is characterized by two line edges caused by laser scribing substantially free from discontinuity. Furthermore, the thin-film structure includes an absorber material comprising at least copper indium selenide compound semiconductor material formed overlying the conductive material including the plurality of line patterns. Moreover the thin-film structure includes a window material overlying the absorber material.

Many benefits can be achieved by applying the embodiments of the present invention. The present invention provides a method for eliminating a thin-film peeling-off problem occurring especially in edge regions during the manufacture of thin-film solar modules. Certain embodiments of the invention are implemented for enhancing photovoltaic efficiency by selecting a soda lime glass substrate containing a trace of sodium species. The soda lime glass substrate with rounded peripheral edge region is selected based on its overall mechanical strength and other properties. Some embodiments are implemented to use a barrier material for blocking un-controlled sodium species from diffusing into thin films formed for the manufacture of the thin-film solar modules, though a small portion of sodium species may pass into a conductor (Mo) film at the rounded edge region where imperfections occur at the transition from the glass surface to the ground rounded surface. Such imperfections may lead to poor coverage by the barrier film allowing direct contact of conductor film to glass in a vicinity of the rounded peripheral edge region. Other embodiment includes utilizing one or laser patterning processes in a conductor material overlying the barrier material to form a trench in the vicinity around the peripheral edge region to remove the conductor material therein. The trench provides a physical restriction to the un-wanted sodium species and prevents them entering the conductor material along their interface in the major surface region. Thus, during high-temperature treatment of the thin films formed in subsequent processes, the possible film peeling-off problem, likely caused by excessive sodium species, is restricted to the edge region outside the trench. Since the film materials outside the trench are removed by an edge deletion process in one of packaging processes for making a monolithically integrated thin-film solar module, peeling in the edge region is not critical. These and other benefits may be described throughout the present specification and more particularly below.

BRIEF DESCRIPTION OF THE DRAWINGS

FIG. 6a is a simplified diagram illustrating a chamber and portions of a process of forming improved barrier materials for fabricating a CIS/CIGS module on soda lime glass according to an embodiment of the present invention;

DETAILED DESCRIPTION OF THE INVENTION

The present invention relates generally to photovoltaic materials and manufacturing methods. More particularly, the present invention provides a method and structure for fabricating thin film solar cells. Merely by way of example, the present method and structure may be used for the manufacture of copper indium gallium diselenide (CIGS) based thin film photovoltaic devices, but it would be recognized that the invention may have other configurations.

Soda lime glass containing alkaline ions, for example greater than 10 wt % sodium oxide is widely used as window glass due to low-cost float-glass techniques for forming various shaped and sized panels. It has also become a top candidate as a large sized substrate for manufacturing new generation thin-film photovoltaic solar devices. One important reason for choosing the soda lime glass other than economical concern is to utilize its coefficient of thermal expansion of about 9.5 ppm/K, at ~25-600° C. that matches quite well with high efficiency thin film photovoltaic materials formed thereon. In addition, sodium species naturally contained in the soda lime glass substrate are found to be an important material ingredient that may positively or negatively affect the thin-film photovoltaic devices formed on the substrate. For example, sodium species as dopants may help form a larger grain size of copper-indium selenide (CIS) based thin-film photovoltaic absorbers that contribute an enhanced energy conversion efficiency of the solar module. In another example, the sodium species from the soda lime glass substrate are also found, if without control, to cause film delamination resulting in poor device performance and other side-effect quality issues. Forming a proper barrier layer between the substrate and the thin-films subsequently formed have been explored and applied (as seen in U.S. Patent Application Publication No. US 2010-0258179 A1, commonly assigned to Stion Corporation of San Jose, Calif. and incorporated herein by reference for all purposes), however, many improvements on the method and structure of barrier materials for encapsulating the soda lime glass for fabricating a high-performance thin-film photovoltaic device are found and disclosed below.

Figure 1:
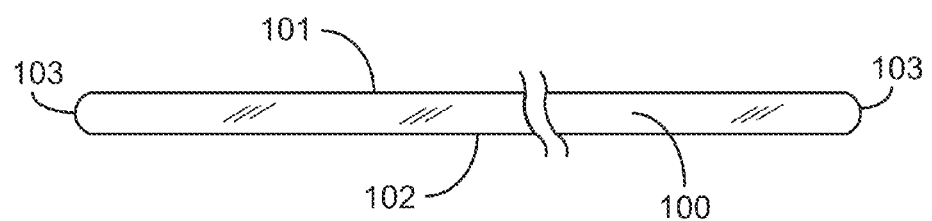
FIGS. 1-6 are simplified diagrams illustrating a series of processes of forming improved barrier materials for fabricating a CIS/CIGS module on soda lime glass according to an embodiment of the present invention.

FIGS. 1-12 are simplified diagrams illustrating a series of processes of forming improved barrier materials for fabricating a CIS/CIGS module on soda lime glass according to an embodiment of the present invention. These diagrams are merely examples, which should not unduly limit the scope of the claims herein. One skilled in the art would recognize other variations, modifications, and alternatives. FIG. 1 shows a soda lime glass substrate 100 is provided in a side view with a front side 101, a backside 102, and edges 103. The backside usually is referred to as the "tin-side" of the float glass. The rounded edges are just examples representing one type of shape available among a variety of glass suppliers. The edge shapes do not affect the inventive features presented throughout the specification and should not be considered as a limiting factor for the scope of claims. In an embodiment, a bilayer barrier material described throughout the specification provides a thin-film structure that is more tolerant of various edge shapes of the glass substrates used for fabricating CIS/CIGS based photovoltaic modules. In a specific embodiment, the glass substrate 100 is a rectangular shaped panel although other shapes are not excluded by the claims herein. For example, it may have a 165 cm×65 cm form factor.

Figure 2:
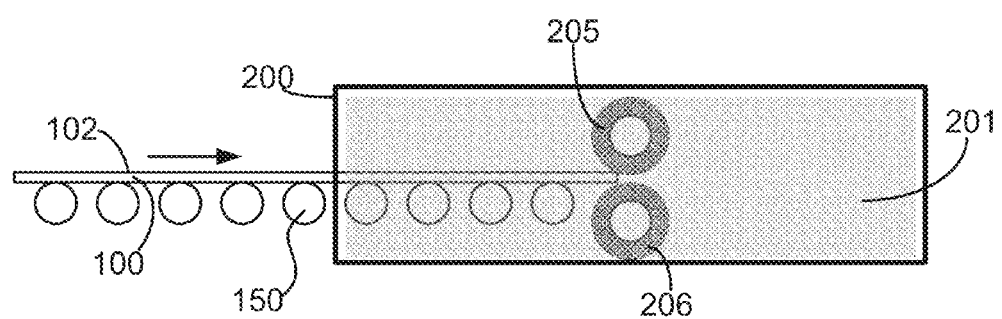

FIG. 2 is a schematic diagram showing a soda lime glass substrate subjected to a cleaning process according to an embodiment of the present invention. The cleaning process is a wet cleaning process including usage of one or more washers disposed in an in-line system. The glass substrate 100 is put through a first washer 200 that uses alkaline liquid detergent 201. The cleaning process may also include rotated brushing from both top and bottom of the glass substrate, air knife blower drying, and rinse spraying. For example, shown in FIG. 2, the substrate 100 is loaded via a moving conveyor device 150 and subjected to brushing via a top brush device 205 and a bottom brush device 206 to clean during the rinse of the liquid detergent 201. It is then dried after moving out of the first washer 200 using an air knife blower device (not shown) and is put through a second washer (not shown) that rinses the substrate using solely deionized water spray. The cleaning process is maintained at a temperature range of between about 25° C. to about 65° C.

Figure 3:
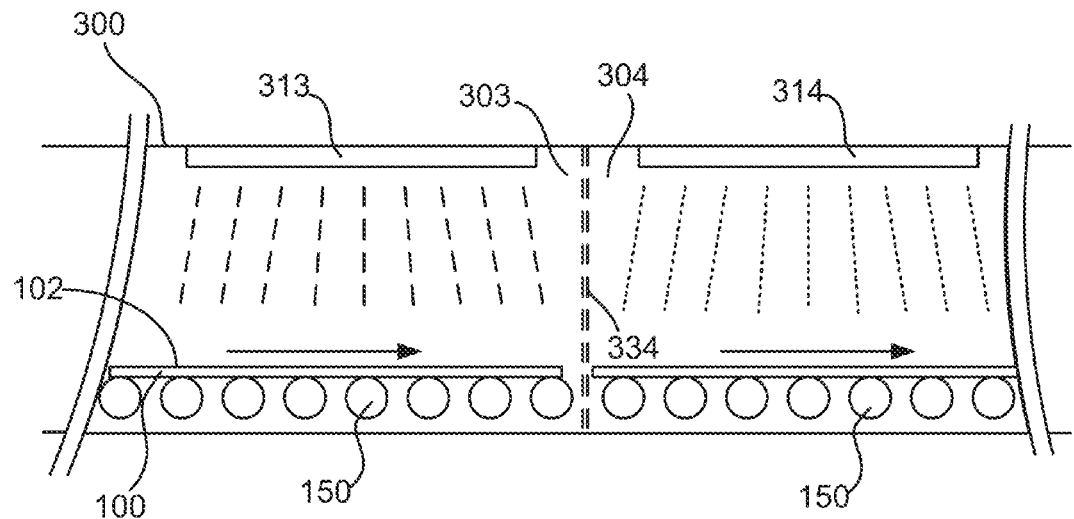

After cleaning, the soda lime glass substrate is transferred via a conveyor device 150 into in-line vacuum deposition system 300. FIG. 3 shows a schematic diagram of subjecting a soda lime glass substrate to a target device in a vacuum environment for thin-film coating. As shown, the soda lime glass substrate 100 has been loaded into a compartment 303 of the in-line vacuum deposition system 300. The system 300 is configured to be laid out with a series of compartments coupled to at least an entry lock, several transfer chambers, and an exit lock (not shown) respectively controlled with different vacuum levels. The conveyor device 150 is set to support the substrate 100 horizontally and move it one after another in a linear motion through each compartment of the system in operation. In an embodiment, the substrate 100 is configured to have it loaded into the system 300 first with its backside 102 facing up and front side 101 resting on a conveyor device 105 carrying the substrate in a speed within a range of about 100 to 200 centimeters per minute and greater. The speed is controlled depending on compartment mechanical setting and coating thickness expected during the whole deposition process.

In a specific embodiment, the system 300 includes several compartments for performing vacuum deposition for a barrier layer coating over the soda lime glass substrate and forming a bottom metal contact film for a thin-film solar module to be formed above. In particular, compartments 303 and 304 represent one or more vacuum environments designed for coating barrier material using physical vapor deposition techniques. One compartment is coupled to a next compartment directly if a single pumping lid shared by them or indirectly via a transfer chambers with vacuum-level variation control, both being simply indicated by dashed double lines 334. If a pumping lid is shared between the compartments, the compartments may be configured to transfer the substrate between them without breaking a vacuum seal, for example. In a specific embodiment, each compartment is equipped with sputtering target devices 313 and 314. The glass substrate 100 has its backside 102 respectively subjected to the target devices 313 and 314. In an example, the target device is made from substantially pure silicon material for forming a silicon bearing film on the substrate. In another embodiment, the vacuum environment in each compartment can be controlled at different levels depending on specific process design. Multi-stage deposition processes may be used to form a first coating of silicon bearing material overlying at least the backside 102 as well as partially the edges 103 of the soda lime glass substrate 100, which will be further used for forming a barrier encapsulating the entire glass substrate.

In an embodiment, the first coating is formed in a continuous two-stage process: a first stage of sputtering deposition at relatively low pressure and high power immediately followed by a second stage of sputtering deposition at higher pressure and lower power. For example, the vacuum compartment 303 is used for the first stage deposition and controlled at a pressure ranging from less than or about 3 microbar to about 50 microbar. Alternatively, the pressure may range less than or about 40 microbar, 30, 20, 18, 16, 14, 12, 10, etc., microbar or less. During the deposition, the compartment 303 is filled with a working gas containing pure Argon gas and mixed with pure Oxygen gas. A flow setting is recommended to be 375 to 450 sccm for Oxygen gas and 500 to 600 sccm for Argon gas. Deposition is performed using a DC Magnetron technique with 30 kW power applied to sputter Si species from the Si target toward exposed surface regions (102 and 103) of the glass substrate 100. With Oxygen in the working gas, silicon dioxide bearing material is formed overlying the exposed surface regions of the substrate 100. In another specific embodiment, the first stage deposition can be performed in two consecutive compartments with similar vacuum conditions as above in both pressure control and $O_2$/Ar working gas flow setting. As shown in FIG. 3, a vacuum compartment 304 is coupled next to the compartment 303 via a transfer unit 334. The compartment 304 has its own pumping lid allowing for varying the pressure and gas flow conditions for the second stage deposition. During the second stage deposition, the pressure in compartment 304 is controlled to be less than or about 20 microbar, such as about 8 microbar with 5-20% $O_2$/Ar gas flow (in an example, 280 sccm $O_2$/1800 sccm Ar) when the substrate 100 is moved in with the same linear speed as in the compartment 303.

Figure 4:
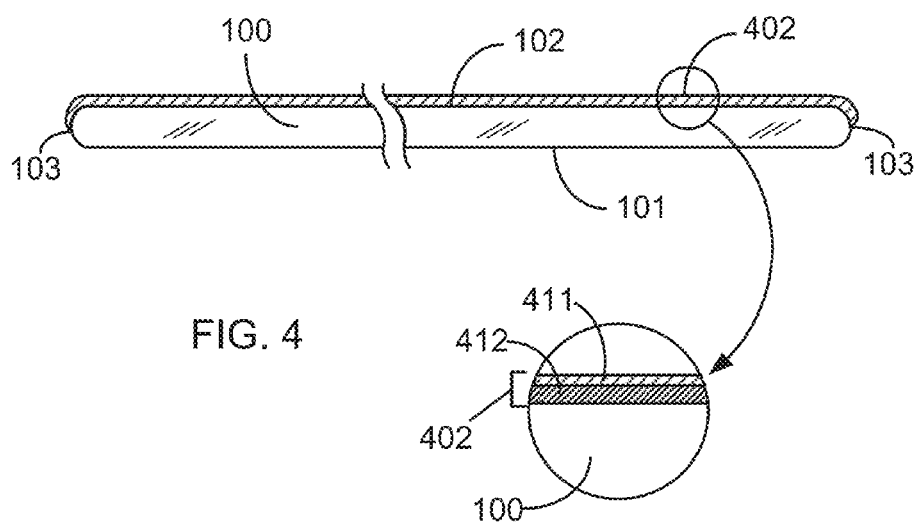

As shown in FIG. 4, the first coating 402 is formed overlying the backside 102 and partially the edges 103 of the soda lime glass substrate 100 when it is passed through the compartments 303, 304 by subjecting the backside 102 to the Si target 313, 314 and the front side 101 being supported by the conveyor device 150. The total thickness of the first coating formed from the continuous two-stage process is approximately 80 nm or less characterized by a refractive index of about 1.45 and the density ranging from 1.0 to about 1.3 g/cm$^3$ or more. As shown in a closer view of the first coating in FIG. 4, the first coating formed in the continuous two-stage process includes a barrier layer 412 overlying directly on glass surface and a seed layer 411 overlying the barrier layer 412. In an example, when the thickness and density of the two stage deposited layers were measured separately the contribution of the barrier layer is about 50 nm having a density of approximately 1.2 g/cm$^3$, while the seed layer is about 30 nm having a density of approximately 0.9 g/cm$^3$ or less. Of course, there are many alternatives, modifications, and variations in the first coating process control.

Figure 5:
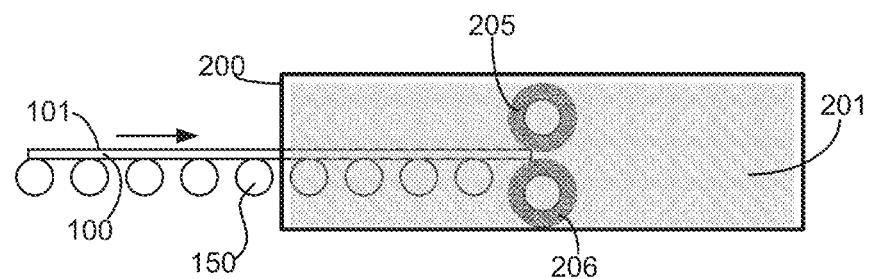

After the first coating is formed in the above-described PVD compartments of the system 300, the soda lime glass substrate 100, having its backside and partial edges being coated by the first coat 402, is unloaded (after breaking up the vacuum environment from system 300) to a pallet. In an embodiment, although the in-line deposition system 300 may include several subsequent compartments coupled after the compartment 304 via a transfer chamber 345 for additional thin-film deposition processes including the formation of a metal contact film as a bottom electrode of a solar module, they may not all be used during for this first coating process. Multiple substrates in the pallet can be stacked and separated by paper to prevent sticking. Then the substrate 100 including the first coating 402 can be re-loaded into the cleaning washer 200 for a second cleaning process, as shown in FIG. 5, with its coated backside on the moving conveyor device and the front side 101 facing up this time. The second cleaning process may be substantially the same as the first cleaning process (see FIG. 2).

Figure 6:
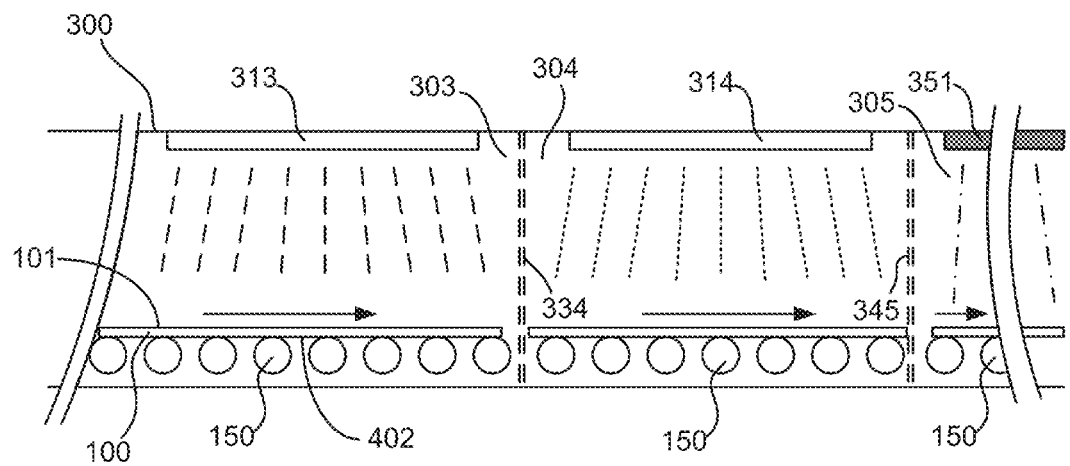

After the second cleaning process, the substrate 100 including the first coating 402 is continuously transported by the conveyor device 150 and reloaded into the in-line deposition system 300 for forming a second coating of silicon bearing material overlying the front side 101 as well as partially the edges 103 of the soda lime glass substrate 100, which will be further used to combine with the first coating for forming a barrier encapsulating the entire glass substrate. Similar to the first coating process, as shown in FIG. 6, the substrate 100 is loaded with a linear speed via the conveyor device 150 into the compartment 303 with front side 101 facing the Si target 313 for a first stage deposition followed by a second stage deposition by subjecting to the Si target 314 in the next compartment 304. The vacuum conditions for both the compartment 303 and compartment 304 may be correspondingly controlled in a fashion similar to the first coating process.

In an alternative embodiment, a single-stage double-side deposition process can be carried out for the formation of the silicon-bearing barrier material. Such a single stage deposition process is schematically illustrated in FIG. 6A, wherein a glass substrate 100 is transported into an inline chamber 303A of a deposition system 300A after the first cleaning process. The substrate 100 is loaded in motion with a predetermined speed through the inline chamber system 300A, with its backside 102 facing a first target device 313A on a first side of the chamber and its front side 101 facing a second target device 313B on a second side of the chamber. For example, the first side is at a bottom side of the inline chamber 303A and the second side is at the top side of the inline chamber 303A. The inline chamber is set to a vacuum condition with a pressure in a range of less than or about 3 microbar to about 6 microbar and may be filled with a working gas comprising pure Argon gas mixed with pure Oxygen gas. Similar to the first stage deposition described before, the flow setting of the working gas can be controlled for both Argon gas and Oxygen gas respectively to 500-600 sccm and 375-450 sccm ranges. Both the first target device 313A and the second target device 313B are selected from pure Silicon sputtering targets. The substrate 100 can be set to ground in a bias setting by grounding the transport conveyor device (not shown explicitly in FIG. 6A). As the substrate 100 is transported through the inline chamber 303A, a DC bias voltage is applied to the two Si target devices from both sides to apply power up to 3 kW to initiate sputtering deposition silicon and reaction with oxygen gas within the chamber. A thickness of silicon oxide material is then formed overlying both the front side 101 and the backside 102 of the substrate 100.

In a specific embodiment, a first coating of silicon oxide material is formed overlying the back side 102 via the first Si target device 313A disposed at the bottom side of the chamber 303A and the second coating of silicon oxide material is formed overlying the front side 101 via a second Si target device 313B disposed at the top side of the chamber 303A. The substrate 100 contains a peripheral edge region 103 which are also substantially covered by the silicon oxide material sputtered from both the first target device 313A and the second target device 313B. In an embodiment, the thickness of silicon oxide material formed in the process described here in the inline chamber with the substrate loaded in motion is able to provide a substantial coverage to the peripheral edge region 103. The coverage of the edge region is tolerant of various edge shapes whether rounded or squared. Since the deposition condition is substantially the same as the process set in the first-stage process, the thickness of silicon material formed in this single-stage double-side deposition process may be similar to that as discussed above. As the result, the front side, backside, and edge region of the substrate 100 is fully covered by the silicon oxide material that is characterized by a thickness of about 50 nm or less and a density of approximately $1.2 \text{ g/cm}^3$ or greater with oxygen-rich concentration.

Figure 7:
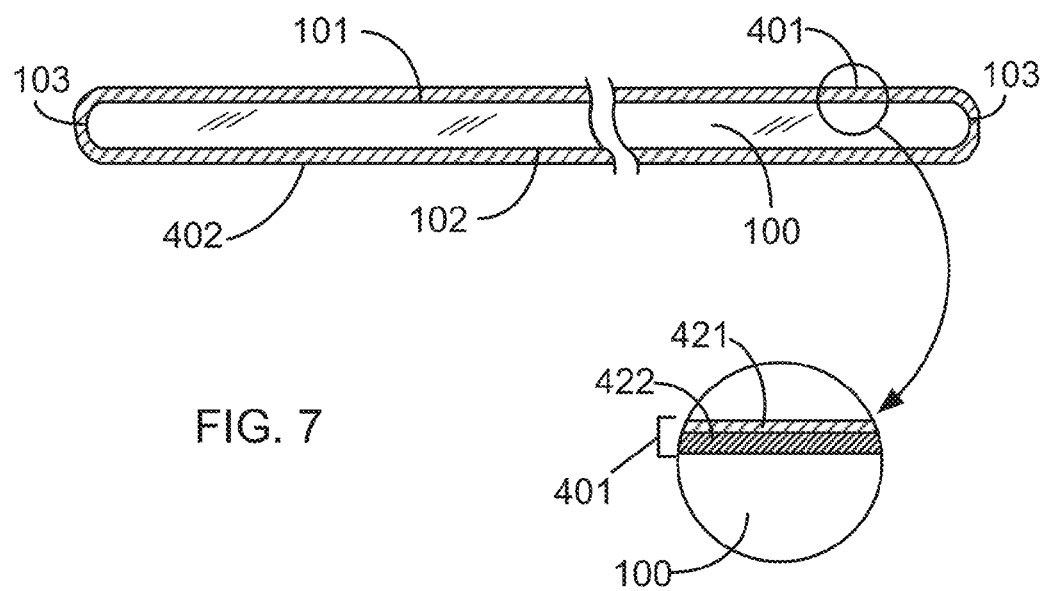
FIGS. 7-12 are additional simplified diagrams illustrating a series of processes of forming improved barrier materials for fabricating a CIS/CIGS module on soda lime glass according to an embodiment of the present invention.

Either through the two-stage deposition process or single-stage double-side deposition process, according to embodiments of the present invention, a coating of silicon oxide material is provided on both the backside 102 and the front side 101 as well as on edge region 103 of the substrate 100, shown in FIG. 7. Process for forming the second coating is substantially the same as forming the first coating. The process includes forming a first thickness of silicon dioxide using a first stage deposition process followed by forming a second thickness of silicon dioxide overlying the first thickness of silicon dioxide using a second stage deposition process. As shown in FIG. 7, the second coating 401 includes a barrier layer 422 formed in the first stage deposition process in vacuum compartment 303 and a seed layer formed in the second stage deposition process in vacuum compartment 304. Both the barrier layer and the seed layer are silicon dioxide bearing material respectively formed in a low-pressure/high-power environment and high-pressure/low-power environment. The former process is also associated with a working gas flow of Argon gas mixed with about 50% Oxygen gas while the latter process is associated with Ar flow mixed with a reduced amount (20% or less and preferably about 10%) of Oxygen. The barrier layer 422 is silicon dioxide material characterized as oxygen rich relative to an oxygen concentration of the silicon dioxide bearing seed layer 421. In another characterized feature, the barrier layer 422 is a denser film having a density of 1.0 to $1.3 \text{ g/cm}^3$ or more compared to that of the seed layer with a density of less than or about $0.9 \text{ g/cm}^3$.

In a specific embodiment, FIG. 7 schematically shows that the second coating 401 substantially covers the front side 101 with a thickness of silicon dioxide material from 10 nm to 100 nm and partially covers edges 103. Combining both the partial edge coverage of the first coating 402 and the partial edge coverage second coating 401, the edges 103 surround the substrate 100 is substantially fully covered by a thickness of silicon dioxide material. In another embodiment, the substrate 100 is entirely encapsulated by a thickness of silicon dioxide material ranging from 10 nm to 100 nm. The thickness of silicon dioxide material comprises a high density silicon oxide material formed in a deposition process involving a lower pressure higher oxygen flow environment to be an effective diffusion barrier layer for the glass substrate. Overlying the barrier layer a seed layer with low density silicon dioxide is caused to form in a deposition process involving higher pressure and lower oxygen flow environment. The seed layer is formed for facilitating the formation of subsequent metal contact film as well as the formation of any scribed line patterns within the metal contact film. More details about the functions played by the coating encapsulated entire glass substrate will be found throughout the specification and particularly below.

Referring to FIG. 6, the substrate 100 is continuously transported by the conveyor device 150 to a next vacuum compartment 305 through a transfer chamber 345 after the second stage deposition process for forming the seed layer 421 in the compartment 304. During the first coating process, the vacuum environment after the formation of the seed layer 411 may be broken, i.e., the compartment 305 and beyond may not be in operation. Now after the second coating process, the vacuum environment associated with the compartment 305 may be maintained throughout the remaining chambers. In a specific embodiment, the substrate 100 is subjecting the seed layer 421 (overlying the barrier layer 422 on the front side 101) to a metal target device 351 in the compartment 305 for depositing a metal contact film overlying the seed layer 421 by sputtering. In another embodiment, the metal sputtering deposition process also includes a multi-stage deposition process including forming a Molybdenum preliminary layer in the compartment 305 followed by forming a Molybdenum bulk layer in several consecutive compartments. Of course, other metal material or non-metal conductive material can be used for forming the contact layer as a bottom electrode of a thin-film photovoltaic cell. Each compartment may contain one or more metal target devices so that an alloyed metal contact film can be formed.

Figure 8:
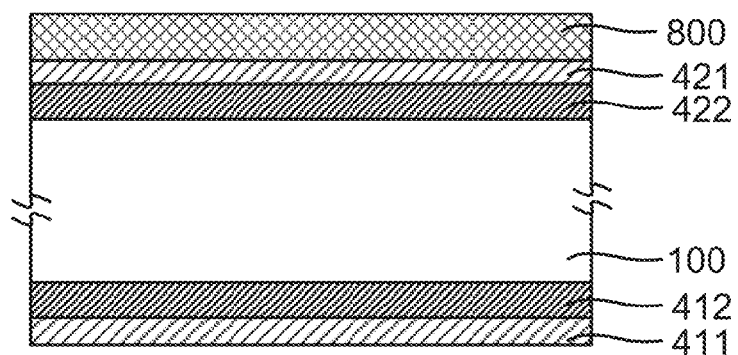

FIG. 8 is a schematic diagram showing a metal contact film formed overlying the encapsulated soda lime glass substrate according to an embodiment of the present invention. As shown, the metal contact film 800 overlays the seed layer 421 comprising low density silicon dioxide material overlying the barrier layer 422 comprising high density silicon dioxide material on the front side 101 of the soda lime glass substrate 100. It shows only a portion of the substrate with the encapsulated coating. In an embodiment, the metal contact film comprises Molybdenum material sputtered from a Mo-bearing target. In an example, the compartment 305 is configured as a rotary single magnetron sputtering chamber for forming a first layer of the metal contact film. The first layer is the Molybdenum preliminary layer (not explicitly shown in FIG. 8). The pressure in the compartment 305 is relatively low (about 4 microbar) and an Argon/10% Oxygen gas mixture is flowed in during deposition. The Molybdenum preliminary layer as formed in the lower pressure and with higher DC power (about 16 kW) applied to a Molybdenum target, in an embodiment, results in a lower molybdenum ablation threshold, making the first layer of the metal contact film 800 easier to scribe. A Molybdenum bulk layer is formed overlying the Molybdenum preliminary layer, continuously in a group of compartments (not shown in FIG. 7) following the compartment 305. The group of compartments are all equipped with Molybdenum targets and set at higher pressure (about 8 microbar or more) and lower power (about 8 kW) is used for sputtering.

Figure 9:
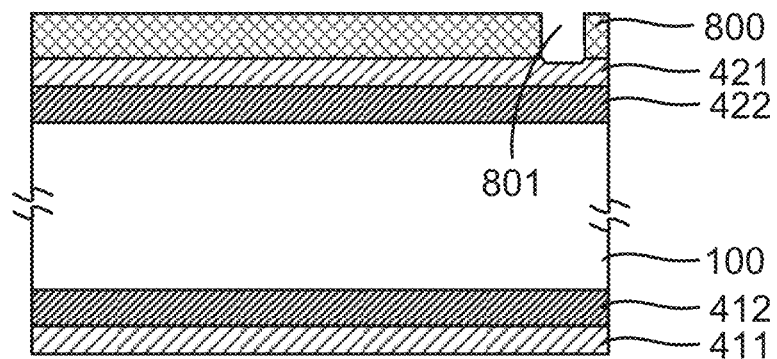

After the formation of the metal contact film overlying the coating of silicon dioxide bearing material that encapsulated the substrate, the substrate including all the overlaid films on the front side is then subjected to a scribing process to form a plurality of line patterns that are configured to form intra-cell and inter-cell electrical links for the thin-film photovoltaic device thereof. FIG. 9 is a schematic diagram of a metal contact film including a line pattern scribed through the film according to an embodiment of the invention. As shown in this schematic side view, the scribe line pattern 801 is a trench cut through the metal contact film 800. In an embodiment, the scribing is performed using a laser ablation technique to remove molybdenum material along a predetermined line with a width defined by the laser spot size. It is desired, for a "good" scribing process, to remove substantially all metal material along the line to form the trench with its bottom being made up almost by silicon dioxide material only. While it may be hard to show the true aspect ratio of the scribed line pattern in the schematic view, as the depth of the trench relative to its width may be several times or also orders of magnitude smaller. This diagram is merely an example, which should not unduly limit the scope of the claims herein. One skilled in the art would recognize other variations, modifications, and alternatives.

As mentioned earlier, a seed layer 421 of low density silicon dioxide material is formed overlying a barrier layer 422 comprising higher density silicon dioxide material with oxygen rich concentration. The Molybdenum preliminary layer is deposited over the seed layer of low density silicon dioxide material on the front side leads to a formation of a $SiO_2$—Mo interface having a reduced laser ablation threshold. As a high-power pulsed laser beam scan along a pattern line, the reduced threshold makes it easier to detach Molybdenum material pieces from underneath silicon dioxide. Laser power causes vaporization or sublimation of the detached material pieces and the formation of line trench with substantially clean edges. The seed layer of low density silicon dioxide material with lower oxygen concentration is believed to provide a surface over the barrier layer that facilitates nucleation and growth of molybdenum material with a lower ablation threshold. This provides a great advantage for the formation of substantially continuous scribing line patterns through a thickness of the metal contact film comprising molybdenum deposited on the seed layer. The barrier layer below the seed layer is characterized by higher density silicon dioxide material and oxygen rich concentration and forms a strong bonding with the glass substrate to ensure an existence of a thickness of silicon dioxide material covering the substrate after the laser scribing. The laser ablation scribing may remove partially the seed layer but still substantially retain the barrier layer as a protective encapsulating layer over the substrate. Additionally, using multi-stage deposition process to form the metal contact film introduces a Molybdenum preliminary layer as a first layer overlying the $SiO_2$ seed layer, which further facilitates the formation of the molybdenum film with a reduced laser ablation threshold.

Figure 10:
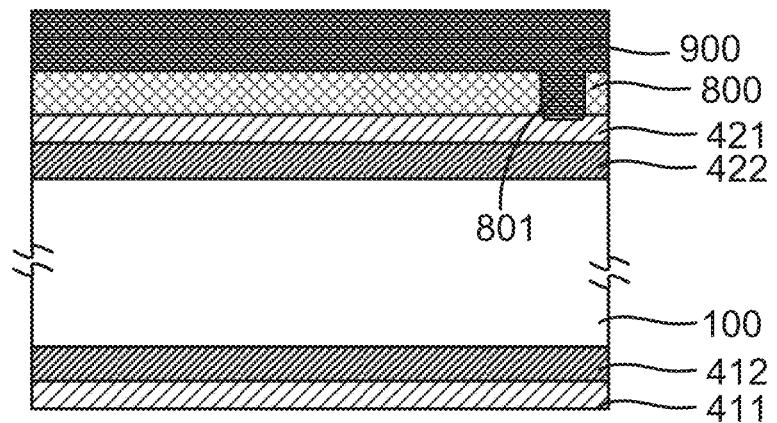

FIG. 10 further shows that an absorber material being formed on the metal contact film including the line pattern for forming a photovoltaic device according to an embodiment of the invention. This diagram is merely an example, which should not unduly limit the scope of the claims herein. One skilled in the art would recognize other variations, modifications, and alternatives. As shown, absorber material 900 is formed overlying the metal contact film 800 including the trenches of line patterns 801. In an embodiment, the absorber material is formed by a two-step film process including a first step for forming several precursor films via vacuum deposition at near room temperature and a second step for thermally treating the precursor films in a gaseous environment with pre-selected reactive gas species required to transform the precursor films into a thin-film absorber material. In an example, copper species, indium species, gallium species, aluminum species, or silver species are deposited as precursors first and the precursor film is then treated in an environment containing reactive selenium species and sulfur species through a predetermined thermal profile to form CIGS-based absorber material. More details about the development of CIGS absorber material for manufacturing thin-film photovoltaic device can be found in U.S. Pat. No. 7,910,399, commonly assigned to Stion Corp. San Jose, incorporated fully herein by reference for all purposes.

An advantage of having a barrier layer encapsulating the entire soda lime glass substrate becomes more prominent throughout the process for forming the absorber material over the metal contact film containing Molybdenum material. The barrier layer (412 in FIGS. 4 and 422 in FIG. 7) is made from a thickness of silicon dioxide material having oxygen rich concentration relative to the seed layer above. This barrier layer, characterized by its high density of proximately 1.2 gram/cm$^3$ or higher, acts as a very effective diffusion barrier to contain native sodium-bearing species inside the soda lime glass substrate. A proper two-stage coating process, as presented in this specification, has led a substantially full coverage of the substrate including front side, backside, as well as all edges so that no unwanted sodium species are leaked through to enter the metal contact film and diffuse to the interface region with the absorber material. It has been found that uncontrolled Sodium species may cause delamination of absorber material from the interface with the metal contact film (containing Molybdenum material). Therefore, by well containing the sodium species inside the soda lime glass substrate to prevent them from diffusing into the subsequently formed metal contact film and the absorber material, the possible cause of film delamination is substantially eliminated.

Figure 11:
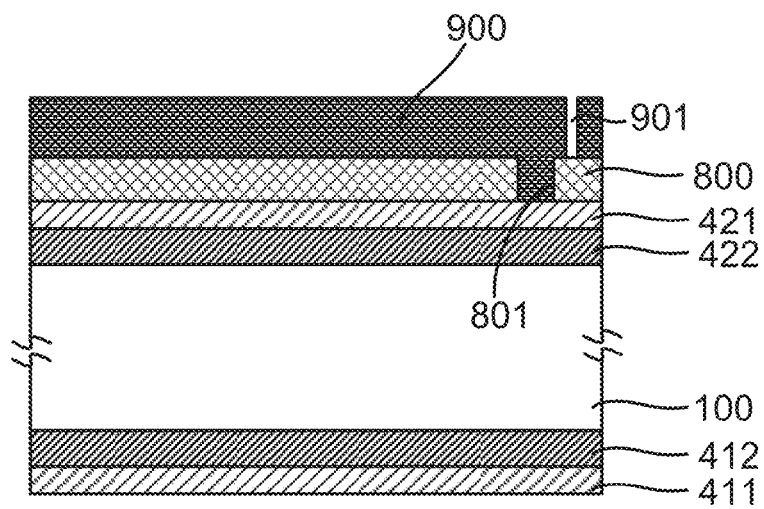
Figure 12:
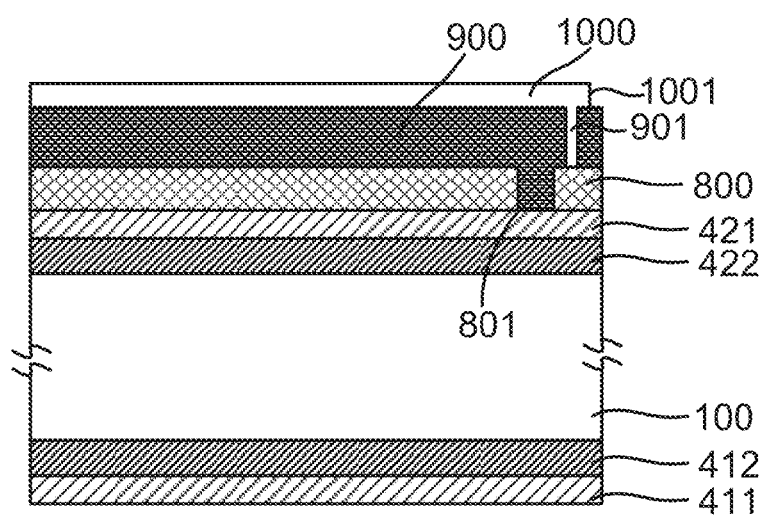

FIG. 11 is a schematic diagram showing a line pattern formed within the absorber material for forming a photovoltaic device according to an embodiment of the invention. This diagram is merely an example, which should not unduly limit the scope of the claims herein. One skilled in the art would recognize other variations, modifications, and alternatives. As shown, a line pattern 901, formed after the formation process of the absorber material, is located at substantially near a region above the line pattern 801 in metal contact film 800. FIG. 12 is a schematic diagram showing a top electrode material formed overlying the window material for completing each photovoltaic cell according to an embodiment of the invention. Window material 1000, which is made from n-type semiconductor and characterized by proper optical properties, forms overlying the absorber material 900 including the line pattern 901. Window material acts, firstly as a transparent medium for the photons from sun light which are absorbed by the absorber material to convert the photons to electrons (-hole pairs), and secondly as active charge collector to draw the electrons from the absorber material. Cell structure built through the thin-film and coupling electric leads help to generate electric currents from cell to cell and output as useful electrical power. A line pattern 1001 is also formed in the window material 1000 and spatially associated with the line pattern 901.

Figure 13:
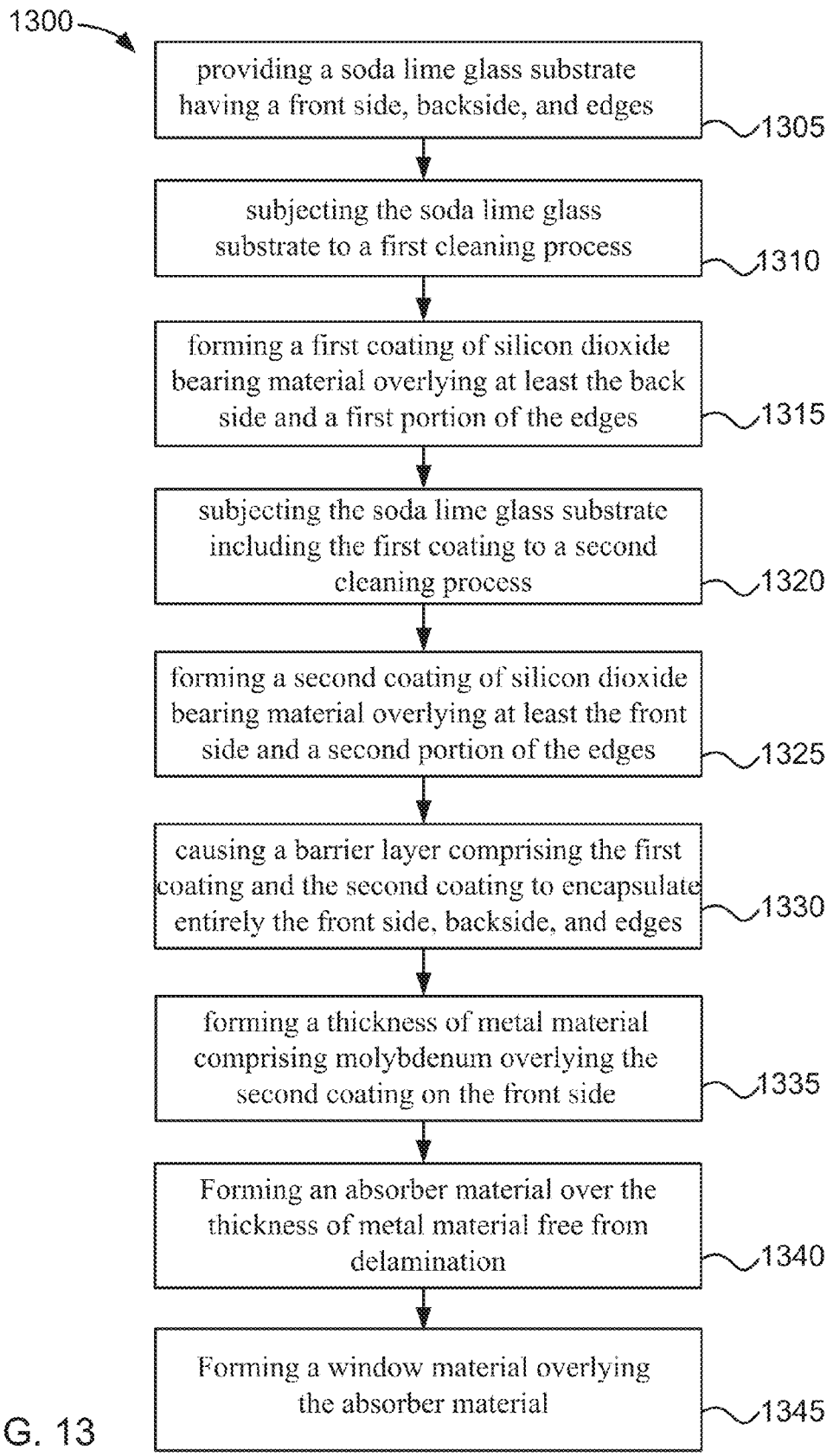
FIG. 13 is a simplified chart illustrating a method of fabricating a CIS/CIGS module according to an embodiment of the present invention.

FIG. 13 is a flowchart summarizing a method for manufacturing thin-film photovoltaic devices on encapsulated soda lime glass substrates according to an embodiment of the present invention. This diagram is merely an example, which should not unduly limit the scope of the claims herein. As shown, the method 1300 includes, at least partially, a series of steps or processes for forming an encapsulated coating over the substrate on which a thin-film photovoltaic device is subsequently formed. In a specific embodiment, the series of steps are summarized as following:

1305. Providing a soda lime glass substrate having a front side, backside, and edges;

1310. Subjecting the soda lime glass substrate to a first cleaning process;

1315. Forming a first coating of silicon dioxide bearing material overlying at least the back side and a first portion of the edges;

1320. Subjecting the soda lime glass substrate including the first coating to a second cleaning process;

1325. Forming a second coating of silicon dioxide bearing material overlying at least the front side and a second portion of the edges;

1330. Causing a barrier layer comprising the first coating and the second coating to encapsulate entirely the front side, backside, and edges;

1335. Forming a thickness of metal material comprising molybdenum overlying the second coating on the front side;

1340. Forming an absorber material over the thickness of metal material free from delamination;

1345. Forming a window material overlying the absorber material.

The above sequence of processes provides a method of forming a barrier layer from a first coating process and second coating process to encapsulate entirely soda lime glass substrate on which a thin-film photovoltaic device is formed substantially free from any film delamination according to an embodiment of the present invention. In a specific embodiment, the method includes advantageously utilizing a continuous two-stage deposition process for firstly forming a barrier layer comprising a first thickness of high density silicon dioxide material overlying the entire surface regions of the substrates including the front side, backside, and all surrounding edges. The two-stage deposition process secondly includes forming a seed layer comprising a second thickness of low density silicon dioxide material overlying the barrier layer. The barrier layer encapsulated entire substrate prevents propagation of Sodium bearing species from soda lime glass into upper films formed subsequently. The seed layer facilitates a formation of substantially continuous line pattern within a metal contact film formed overlying the seed layer as a bottom electrode of thin-film photovoltaic device formed thereon. The method 1300, in one or more embodiments, has been at least partially illustrated in the FIGS. 1-12 in terms of process operation as well as process results. Further details of the method can be found throughout the present specification. Of course, one ordinary skilled in the art should recognize many variations, alternative, and modifications of the method from the examples illustrated in FIGS. 1 through 12. For example, some steps shown in FIG. 13 may be combined, deleted, switched in order, replaced by one or more steps, and some more steps may be inserted without limiting the scope of the claims herein. In an example, the first cleaning and the second cleaning process are combined and the first coating of silicon oxide material and the second coating of silicon oxide material are formed by a single-stage double-side deposition process based on substantially the same vacuum/gas-flow conditions set for the first stage process in above two-stage deposition processes. In other words, the first coating can be replaced by forming a barrier layer overlying entirely the substrate including the front side, backside, and edges. The barrier layer is characterized by a first thickness of silicon dioxide bearing material with oxygen-rich concentration and relatively high density. Following that, a seed layer at least can be formed only overlying the barrier layer on the front side of the substrate. The seed layer is characterized by a second thickness of silicon dioxide bearing material with oxygen-poor concentration and lower density compared to the barrier layer. The continuous two-stage deposition process by subjecting the substrate to alternate sputtering targets in different vacuum compartments may be replaced by process of subjecting the substrate to a single chamber with sputtering targets disposed at both top and bottom side, or may be replaced by a chemical vapor deposition or thermal evaporation or atomic deposition for achieving different densities for different layers of the silicon dioxide coating to encapsulate the entire substrate.

Figure 14:
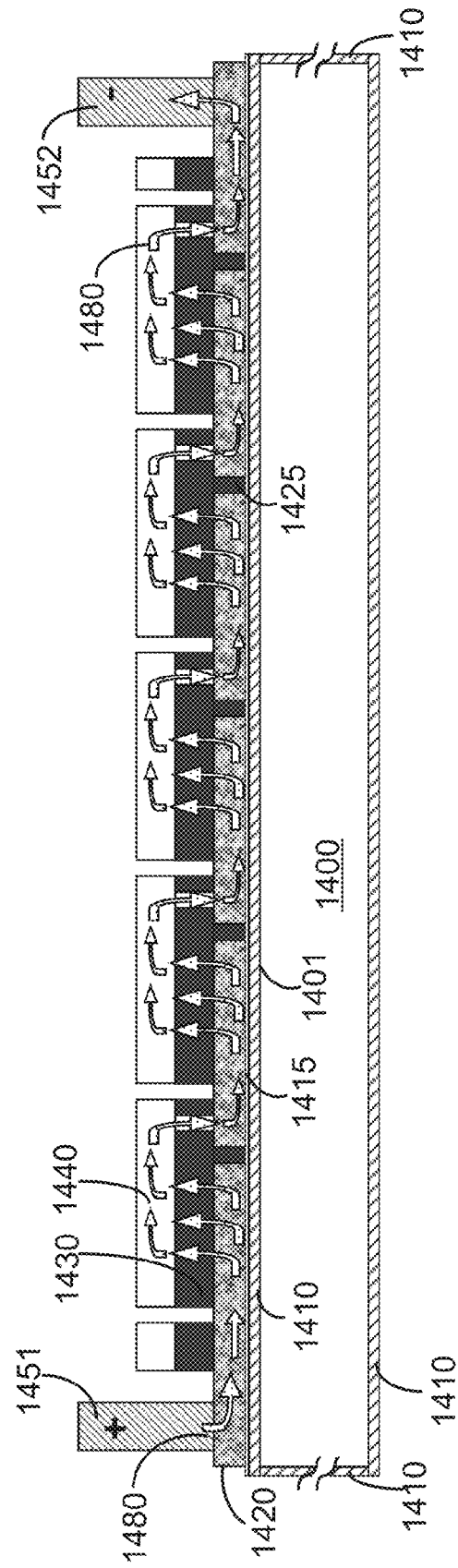
FIG. 14 is a simplified diagram of thin-film photovoltaic cells formed on an encapsulated soda lime glass substrate according to an embodiment of the present invention.

FIG. 14 is a simplified diagram of a sectional view of thin-film photovoltaic cells formed on an encapsulated soda lime glass substrate according to an embodiment of the present invention. This diagram is merely an example, which should not unduly limit the scope of the claims herein. One of ordinary skill in the art would recognize many variations, alternatives, and modifications. As shown, a soda lime glass substrate 1400 is encapsulated by a barrier layer 1410. In an embodiment, the barrier layer 1410 comprises at least a thickness of silicon dioxide material characterized by a density of about 1.0 to 1.3 grams/cm$^3$ or more. In another embodiment, a seed layer 1415 can be formed overlying at least a portion of the barrier layer 1410 that covers entire front side 1401 of the substrate 1400, where the "front side" 1401 refers to the side on which the thin-film device is formed. The front side is opposite to a "backside" that corresponds to "tin-side" of the soda lime glass made by floating glass technique. Furthermore, a thickness of metal contact film 1420 comprising molybdenum is formed overlying the seed layer 1415 to serve as a bottom electrode layer. In particular, the electrode layer includes a plurality patterned cell lines 1425 for cell-cell coupling. Above the electrode layer 1420, an absorber material 1430 is formed and also patterned according to each cell line. Moreover, a window layer combined with a transparent conductor material is formed overlying the absorber material 1430, forming a top electrode layer 1440 for each cell. On two side edge regions of the encapsulated substrate, a pair of electrical leads 1451, 1452, for example, a pair of conductor busbars, are respectively laid out to serve an anode or cathode for the thin-film photovoltaic module that includes all the cells formed on the front side of the substrate. As the thin-film photovoltaic module is in operation under sun light, a photoelectric current 1480 can be generated through all cells thereon when the electric leads 1451 and 1452 are connected to a power grid. Of course, there are many variations, alternatives, and modifications.

Figure 15:
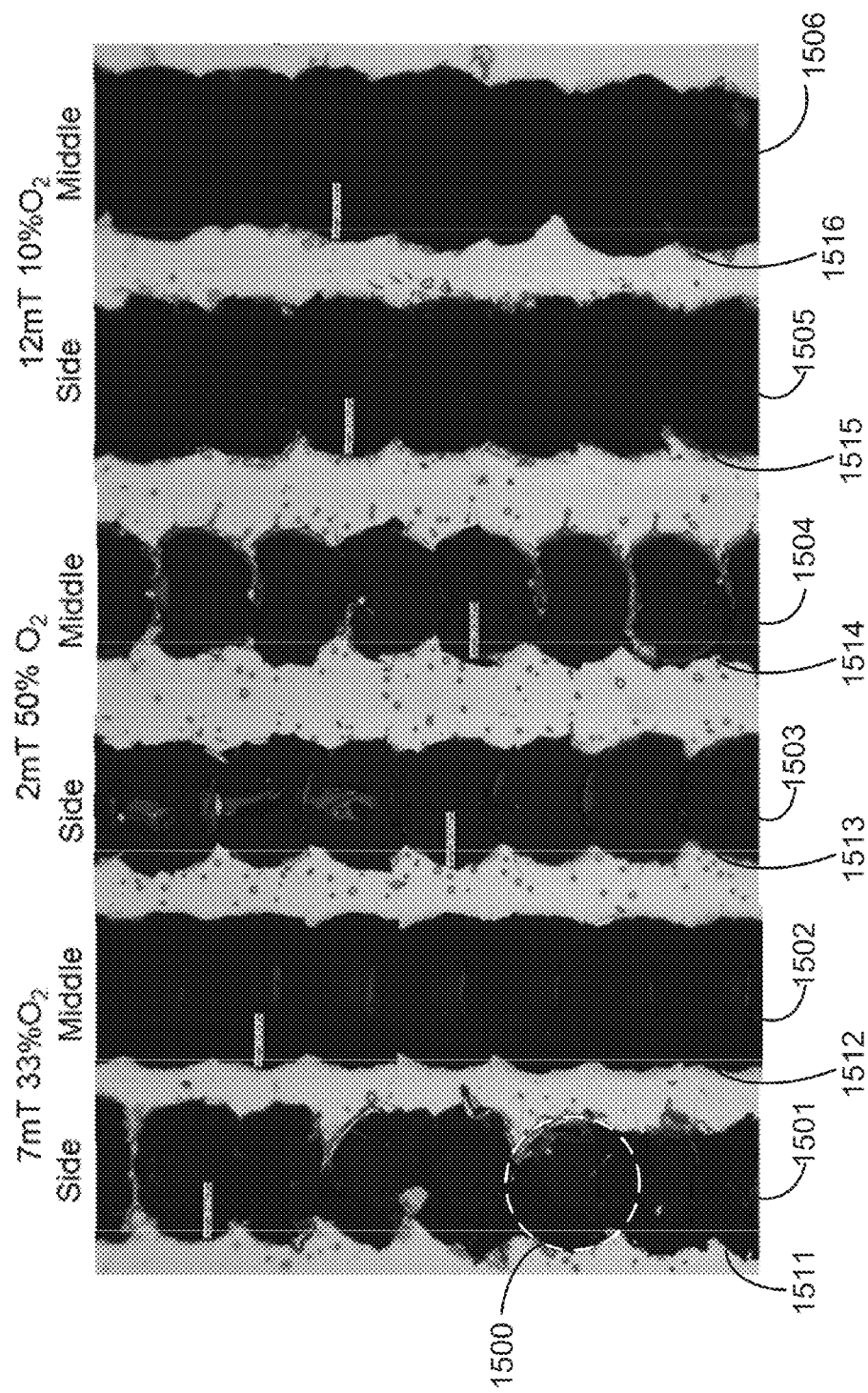
FIG. 15 illustrates a photograph of scribe line profiles of a metal contact film overlying silicon dioxide material formed with different process conditions according to examples of the present invention.

FIG. 15 illustrates a photograph of scribe line profiles of a metal contact film overlying silicon dioxide material formed with different process conditions according to examples of the present invention. This diagram is merely an example, which should not unduly limit the scope of the claims herein. As shown, three sets of scribe line profiles of a metal contact film are compared in terms of the uniformity of the scribing and continuity of line edges in association with the chamber pressure/oxygen flow settings. The scribing is performed using laser ablation technique by irradiation a laser beam onto the metal contact film. The laser beam with certain beam intensity profile causes film material melting or sublimation under a spot 1500. Further, either by moving the substrate or scanning the laser beam a scribing line can be formed. Under properly selected laser beam profile and scanning parameters, a desired scribing profile includes a trench line with the metal film material within the trench being substantially removed and a continuous edge line being formed along the scanning direction, depending on laser ablation threshold associated with the particular metal film formed on the seed layer. These scribing lines are intended for forming line patterns in the metal contact film to create patterned bottom electrode for each of a plurality stripe shaped photovoltaic cells of a thin-film solar module.

As shown in FIG. 15, three sets of scribing lines are respectively associated with three Molybdenum films formed on three kinds of silicon dioxide seed layer. The Molybdenum film is formed under substantially the same condition while the corresponding silicon dioxide seed layer is formed under different vacuum condition especially in pressure and working gas flow setting. Each of the three sets of scribing profiles includes one scribe line (1501, or 1503, or 1505) obtained near edge region of the substrate (closer to chamber wall in general) and another (1502, or 1504, or 1506) in a vicinity of middle region of the substrate. In a first example, two scribe lines 1501, 1502 formed by scribing a Mo film overlying a silicon dioxide bearing seed layer which is formed under 7 mT pressure and a working gas flow of 33% Oxygen mixed with Argon. The corresponding line edges 1511, 1512 appears relatively fuzzy or lack of continuity. The wall side line edge 1511 much worse than middle line edge 1512. Near wall side of the vacuum compartment the resistivity of the deposited molybdenum film near substrate edge region is lower than that near a middle region, which may be caused by the density of molybdenum crystal packing distribution. The change in crystalline packing results in a "fuzzier" scribe along the wall side of the glass substrate. In another example, the silicon dioxide bearing seed layer is formed under a lower pressure of about 2 mT and a working gas flow of 50% Oxygen mixed with Argon. Two lines 1503, 1504 are obtained by scribing a Mo film formed on the above seed layer respectively near wall side and middle region. In yet another example, the vacuum condition for forming the silicon dioxide seed layer is changed to 12 mT and working gas flow is set to reduce Oxygen to only 10%. Two scribe lines 1505, 1506 are obtained. As seen, the profiles of scribe lines 1505, 1506 have much improvement in line uniformity compared to scribe profiles of other lines 1501-1504. Continuity of line edges 1515, 1516 is also obviously better. This is confirmed that a silicon dioxide seed layer with Oxygen poor characteristics does facilitate nucleation and growth of a Mo film thereon with a reduced laser ablation threshold. Other characterization techniques including isolation resistance measurement, voltage mapping, and thickness measurement are also carried to support the formation of substantially continuous line patterns in the metal contact film following the processes described above according to one or more embodiments of the current invention.

It is also understood that the examples, figures, and embodiments described herein are for illustrative purposes only and that various modifications or changes in light thereof will be suggested to persons skilled in the art and are to be included within the spirit and purview of this application and scope of the appended claims. Further details of the method for manufacturing a thin-film solar module substantially free of any film peeling can be found throughout the present specification.

What is claimed is:

1. A method of fabricating a thin film photovoltaic device comprising:
   providing a soda lime glass substrate having a front side, backside, and edges;
   subjecting the soda lime glass substrate to a first cleaning process;
   forming a first coating of silicon dioxide bearing material overlying at least the backside and a first portion of the edges of the soda lime glass substrate in a vacuum environment;
   subjecting the soda lime glass substrate including the first coating to a second cleaning process outside the vacuum environment;
   forming a second coating of silicon dioxide bearing material overlying at least the front side and a second portion of the edges of the soda lime glass substrate in the vacuum environment;
   causing a barrier layer comprising the first coating and the second coating to encapsulate entirely the front side, backside, and edges, the barrier layer comprising at least a thickness of oxygen rich silicon dioxide to contain any sodium bearing material within the soda lime glass substrate;
   forming a thickness of metal material comprising molybdenum overlying the second coating on the front side of the soda lime glass substrate;
   forming an absorber material comprising a copper species, indium species, gallium species, selenide species, and sulfide species overlying the thickness of metal material;
   forming a window material overlying the absorber material; and
   forming an electrode material overlying the window material.

2. The method of claim 1 wherein forming the first coating and forming the second coating comprise subjecting the backside and the front side of the soda lime glass substrate respectively under a silicon bearing target device for sputtering within the vacuum environment.

3. The method of claim 2 wherein the vacuum environment is part of an in-line system comprising a series of compartments with independently controlled vacuum conditions, wherein three compartments are configured to form the first coating and the second coating.

4. The method of claim 2 wherein the soda lime glass substrate is set to move within the vacuum environment in a linear speed of about 100 to 200 centimeters per minute and greater.

5. The method of claim 1 wherein forming the second coating further comprises forming a first thickness of silicon dioxide using a first deposition process followed by forming a second thickness of silicon dioxide overlying the first thickness of silicon dioxide using a second deposition process, the first thickness of silicon dioxide being from about 10 nanometers to 100 nanometers with a density of about 1.0 to 1.3 grams/cm3 and the second thickness of silicon dioxide being about 10 nanometers and greater with a density of about 0.9 grams/cm3 or less.

6. The method of claim 5 wherein the first thickness of silicon dioxide is substantially the barrier layer being oxygen rich relative to an oxygen concentration of the second thickness of silicon dioxide.

7. The method of claim 5 wherein the first deposition process comprises applying a DC power of about 30 kW to a first silicon bearing target at a pressure ranging from 3 micro bar to 6 micro bar with Argon gas flow mixed with nearly 50% Oxygen.

8. The method of claim 5 wherein the second deposition process comprises applying a DC power of about 13 kW to a second silicon target at a pressure of about 8 micro bar or greater with Argon gas flow mixed with less than 20% Oxygen.

9. The method of claim 5 wherein forming the thickness of metal material comprises depositing the metal material overlying the second thickness of silicon dioxide without breaking up the vacuum environment for forming the second coating.

10. The method of claim 5 further comprising scribing through the thickness of metal material to form a plurality of substantially continuous pattern lines; whereupon the second thickness of silicon dioxide with a density of about 0.9 grams/cm3 or less facilitates the formation of the substantially continuous pattern lines.

11. The method of claim 1 wherein the first cleaning process and the second cleaning process are wet cleaning processes comprising alkaline liquid detergent and water maintained at a temperature range of 25 Degrees Celsius to 650 Degrees Celsius.

12. The method of claim 1 wherein forming the thickness of metal material further comprises performing a multiple-stage sputtering deposition process by subjecting a molybdenum target in a series of compartments coupled to the vacuum environment including at least a first compartment with relative low-pressure high-power and about 10% oxygen in working gas flow compared to a few more consecutive compartments with high-pressure low-power and pure Argon in working gas flow.

13. The method of claim 1 wherein forming the absorber material comprising depositing copper species, indium species, gallium species as precursors separately and thermally treating the precursors in an environment comprising gaseous selenide species and sulfide species, the absorber material being free from any de-lamination from the metal material as the soda lime glass substrate is encapsulated entirely by the barrier layer.

14. The method of claim 1 wherein forming the first coating and forming the second coating further comprise maintaining the soda lime glass substrate at room temperature to about 50 Degrees Celsius.

15. A method of fabricating a thin film photovoltaic device comprising:
- providing a soda lime glass substrate having a front side, backside, and edges;
- subjecting the soda lime glass substrate including the front side and back side to a first cleaning process;
- forming a first coating of silicon dioxide bearing material overlying at least the back side and a portion of the edges of the soda lime glass substrate by subjecting a first silicon bearing target within a first vacuum environment;
- subjecting the soda lime glass substrate with the first coating to a second cleaning process;
- turning over the soda lime glass substrate;
- forming a second coating of silicon dioxide bearing material overlying at least the front side and a remaining portion of the edges of the soda lime glass substrate by subjecting a second silicon bearing target within a second vacuum environment;
- causing a barrier layer comprising the first coating combined with the second coating to encapsulate entirely the front side, backside, and edges of the soda lime glass substrate to contain any sodium bearing material within the soda lime glass substrate;
- forming a thickness of metal material comprising molybdenum overlying the barrier layer on the front side of the soda lime glass substrate without breaking the second vacuum environment;
- forming an absorber material comprising a copper species, indium species, gallium species, and a sulfide species overlying the thickness of metal material;
- forming a window material comprising an n-type semiconductor overlying the absorber material; and
- forming an electrode material overlying the window material;
- wherein the barrier layer includes a first thickness of silicon dioxide and a second thickness of silicon dioxide overlying the first thickness of silicon dioxide, wherein the first thickness of silicon dioxide is oxygen rich relative to an oxygen concentration of the second thickness of silicon dioxide, the first thickness of silicon dioxide having a higher density compared to the second thickness of silicon dioxide, wherein the second thickness of silicon dioxide facilitates a formation of substantially continuous line patterns through the thickness of metal material while the first thickness of silicon dioxide facilitates adhesion of the metal material to the absorber material substantially free from any de-lamination.

\* \* \* \* \*